United States Patent
Paranjpe et al.

(10) Patent No.: US 9,761,671 B2
(45) Date of Patent: Sep. 12, 2017

(54) ENGINEERED SUBSTRATES FOR USE IN CRYSTALLINE-NITRIDE BASED DEVICES

(71) Applicant: Veeco Instruments, Inc., Plainview, NY (US)

(72) Inventors: Ajit Paranjpe, Basking Ridge, NJ (US); Craig Metzner, Simi Valley, CA (US); Joe Lamb, Camarillo, CA (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 14/585,426

(22) Filed: Dec. 30, 2014

(65) Prior Publication Data
US 2015/0187888 A1 Jul. 2, 2015

Related U.S. Application Data

(60) Provisional application No. 61/921,978, filed on Dec. 30, 2013.

(51) Int. Cl.
| | | |
|---|---|---|
| *H01L 21/18* | (2006.01) | |
| *H01L 21/304* | (2006.01) | |
| *H01L 21/683* | (2006.01) | |
| *H01L 29/20* | (2006.01) | |
| *H01L 33/00* | (2010.01) | |

(52) U.S. Cl.
CPC ........ *H01L 29/2003* (2013.01); *H01L 21/187* (2013.01); *H01L 21/304* (2013.01); *H01L 21/6835* (2013.01); *H01L 21/6836* (2013.01); *H01L 33/0079* (2013.01); *H01L 33/0075* (2013.01); *H01L 2221/68368* (2013.01); *H01L 2221/68381* (2013.01)

(58) Field of Classification Search
CPC ..... H01L 33/007; H01L 33/12; H01L 21/187; H01L 21/6836; H01L 33/0079; H01L 21/304; H01L 29/2003
See application file for complete search history.

(56) References Cited

U.S. PATENT DOCUMENTS

| | | |
|---|---|---|
| 6,335,263 B1 | 1/2002 | Cheung et al. |
| 8,436,363 B2 | 5/2013 | Werkhoven et al. |
| 8,450,184 B2 | 5/2013 | Bedell et al. |

(Continued)

FOREIGN PATENT DOCUMENTS

| | | |
|---|---|---|
| JP | 2005340308 A | 12/2005 |
| JP | 2006140445 A | 6/2006 |

OTHER PUBLICATIONS

US Searching Authority: International Search Report and Written Opinion, PCT/2014/072770 dated Apr. 21, 2015, 21 pages.

*Primary Examiner* — Mohsen Ahmadi
(74) *Attorney, Agent, or Firm* — Holzer Patel Drennan

(57) ABSTRACT

A spalling process can be employed to generate a fracture at a predetermined depth within a high quality crystalline nitride substrate, such as a bulk GaN substrate. A first crystalline conductive film layer can be separated, along the line of fracture, from the crystalline nitride substrate and subsequently bonded to a layered stack including a traditional lower-cost substrate. If the spalled surface of the first crystalline conductive film layer is exposed in the resulting structure, the structure can act as a substrate on which high quality GaN-based devices can be grown.

13 Claims, 12 Drawing Sheets

(56) References Cited

U.S. PATENT DOCUMENTS

| | | | |
|---|---|---|---|
| 2003/0114017 A1* | 6/2003 | Wong | H01L 21/0242 |
| | | | 438/778 |
| 2008/0169483 A1 | 7/2008 | Kasai et al. | |
| 2010/0310775 A1 | 12/2010 | Bedell et al. | |
| 2012/0205661 A1* | 8/2012 | Kyono | H01L 33/007 |
| | | | 257/76 |
| 2013/0039664 A1* | 2/2013 | Clifton | H01L 31/0352 |
| | | | 398/200 |
| 2013/0092950 A1* | 4/2013 | Fujikura | C30B 29/403 |
| | | | 257/76 |
| 2014/0242807 A1 | 8/2014 | Bedell et al. | |
| 2014/0291282 A1* | 10/2014 | Bedell | B32B 43/006 |
| | | | 216/2 |
| 2014/0312576 A1* | 10/2014 | Bedell | B25B 11/005 |
| | | | 279/3 |
| 2015/0069420 A1* | 3/2015 | Paranjpe | H01L 33/0079 |
| | | | 257/79 |
| 2015/0179428 A1* | 6/2015 | Bayram | H01L 21/0254 |
| | | | 438/458 |

* cited by examiner

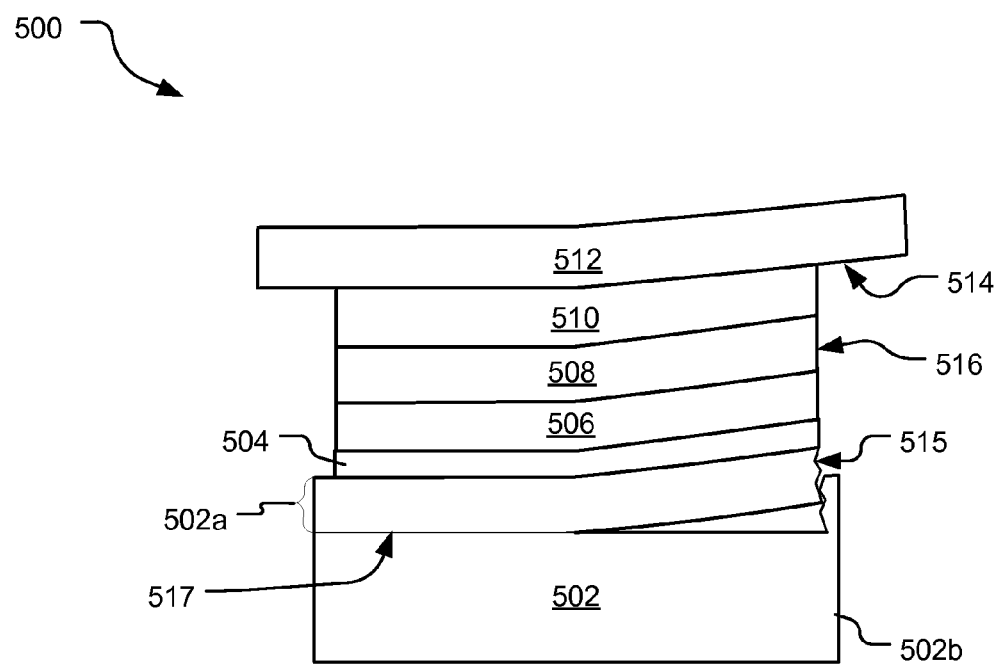
FIG. 5
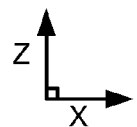

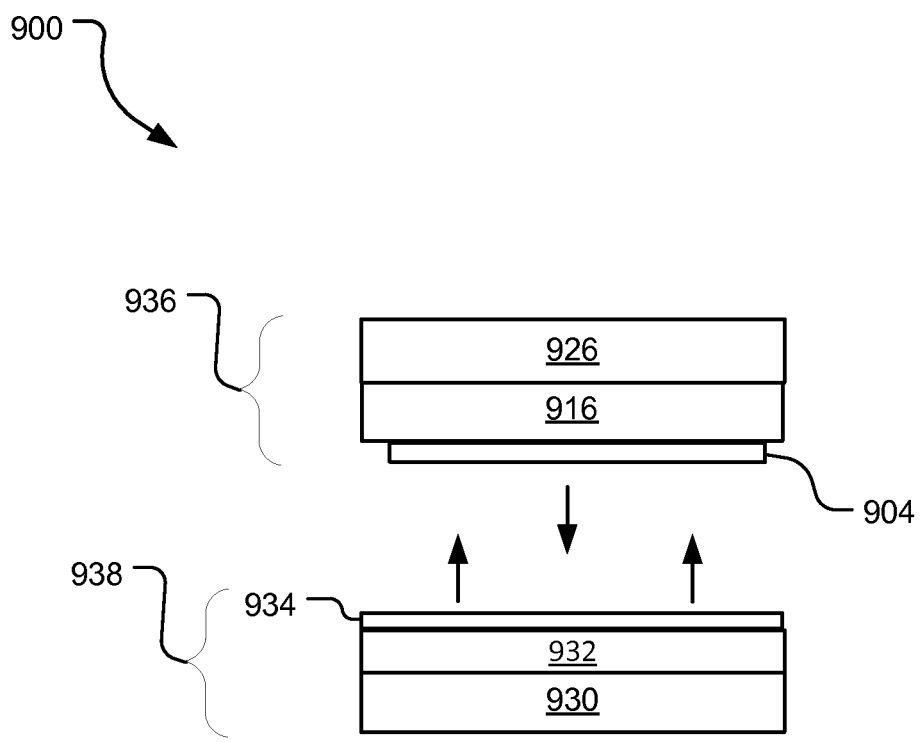
FIG. 9
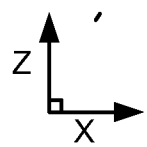

ENGINEERED SUBSTRATES FOR USE IN CRYSTALLINE-NITRIDE BASED DEVICES

CROSS-REFERENCE TO RELATED APPLICATIONS

The present application claims benefit of priority to U.S. Provisional Application No. 61/921,978 entitled "Engineered Substrates for Use in GaN-Based Devices and filed on Dec. 30, 2014," which is specifically incorporated by reference for all that it discloses or teaches.

BACKGROUND

Gallium nitride (GaN)-based devices such as light-emitting diodes (LEDs) and High Electron Mobility Transistor (HEMT) devices may be grown on a variety of substrates such as bulk GaN, sapphire, patterned sapphire (PSS), silicon carbide, silicon, etc. However, GaN-based devices grown on bulk GaN substrates significantly out-perform similar devices grown on other types of substrates. Specifically, GaN-based devices grown on bulk GaN substrates exhibit superior crystal quality and low GaN defect density as compared to similar devices grown on other substrates. This superior crystal quality allows GaN-based devices formed on bulk GaN substrates to operate at substantially higher current densities resulting in two to four times the light output (lumens) per unit area of similar GaN-based devices formed on traditional substrates.

Due to cost constraints, bulk GaN substrates are not economically viable for a majority of GaN-based device applications. A variety of challenges must be addressed to engineer high-performance, economically viable substrates.

SUMMARY

The disclosed technology addresses the foregoing by providing an engineered substrate for growing layers of a GaN-based device such as an LED or HEMT device. The engineered substrate includes a high quality GaN layer and a traditional, low-cost substrate such as sapphire, patterned sapphire (PSS) or silicon carbide. A mechanical lift-off (MLO) process is utilized to induce a fracture in a bulk GaN substrate to lift off a layer of high quality GaN. The layer of high quality GaN is subsequently bonded to a thin film stack including the traditional substrate.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

BRIEF DESCRIPTIONS OF THE DRAWINGS

FIG. 5 illustrates a spalling operation of an example layer stack during formation of an engineered substrate for use in a GaN-based device.

FIG. 9 illustrates bonding of an upper stack to a lower stack during another stage in formation of an engineered substrate for use in a GaN-based device.

DETAILED DESCRIPTION

According to one implementation, an engineered substrate for a GaN-based device includes a thin high quality layer of GaN material that is bonded to a traditional, lower-cost substrate, such as sapphire, patterned sapphire (PSS), silicon carbide, silicon, etc. The resulting engineered substrate has an increased economic viability due, in part, to the fact that the bulk GaN substrate can be reused to form many different engineered substrates. Despite increased economic viability of engineered substrates, significant challenges exist in developing suitable manufacturing techniques. For example, some techniques used to separate high quality GaN material from a bulk GaN substrate result in subsurface damage to the high quality GaN material.

Among other tools and techniques, the herein-disclosed technology provides a method for engineering substrates that eliminates a risk of sub-surface damage to high quality GaN material. In particular, the disclosed technology uses a mechanical lift-off (MLO) process to separate high quality GaN layers from a bulk GaN stack. Although the systems and methods described herein refer specifically to GaN layers and bulk GaN substrates, it should be understood that other conductive materials may be used in place of GaN, including without limitation aluminum nitride (AlN), aluminum gallium nitride (AlGaN), and indium gallium-nitride (InGaN). Collectively, these materials suitable for use in GaN-based devices (e.g., LEDs and HEMTs) are referred to herein "crystalline nitrides," such as crystalline nitrides in groups III, IV, and V of the periodic table ("crystalline III-V nitrides").

As used herein, the term "quality" with reference to a crystalline nitride layer (e.g., a GaN layer) refers to dislocation density. A lower dislocation density is indicative of a higher quality crystalline nitride layer. Typical dislocation density for GaN growth on sapphire is greater than approximately $1e^8$ cm$^{-2}$, which arises from lattice structure and the coefficient of thermal expansion (CTE) mismatch between GaN and sapphire. For bulk GaN substrates, substantially lower dislocation densities (e.g., approximately $1e^4$ cm$^{-2}$ to $1e^6$ cm$^{-2}$) can be achieved based on the method of growth and the bulk GaN thickness.

Figure 1:
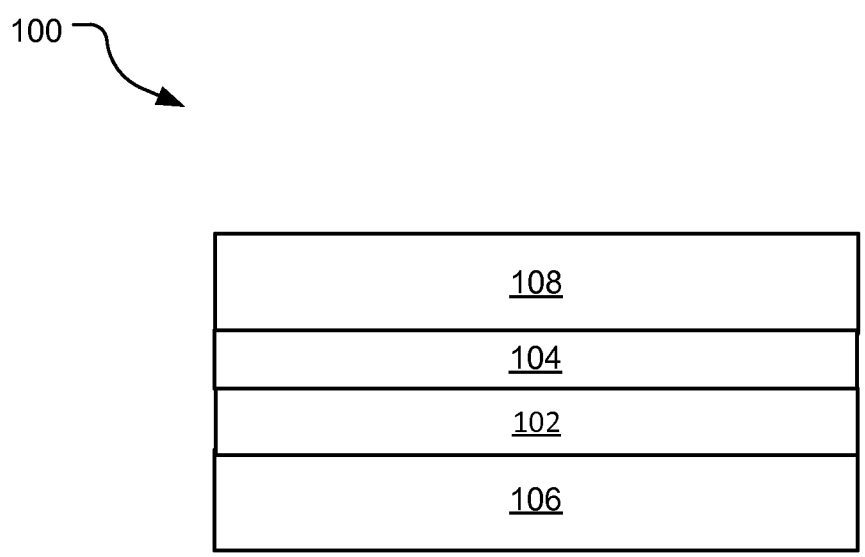
FIG. 1 illustrates an example-engineered substrate on which a GaN-based device, such as an LED or HEMT device, can be grown.

FIG. 1 illustrates an example-engineered substrate 100 on which a GaN-based device, such as an LED or HEMT device, can be grown. A traditional low-cost substrate 106 forms a base of the engineered substrate 100 and may include one of a number of suitable low-cost substrate materials, such as sapphire, PSS, or silicon carbide (SiC). A low quality GaN film layer 102 is formed (e.g., grown) on the traditional substrate 106, and a comparatively high quality GaN film layer 108 is affixed to the lower quality GaN film layer 102 by way of a bonding layer 104.

According to one implementation, a spalling technique is used to remove the high quality GaN film layer 108 from a bulk GaN substrate (not shown) prior to bonding the high quality GaN film layer 108 to the low quality GaN film layer 102. Spalling allows for a controlled fracturing of the bulk GaN material that does not result in subsurface damage near the fracture site.

Figure 2:
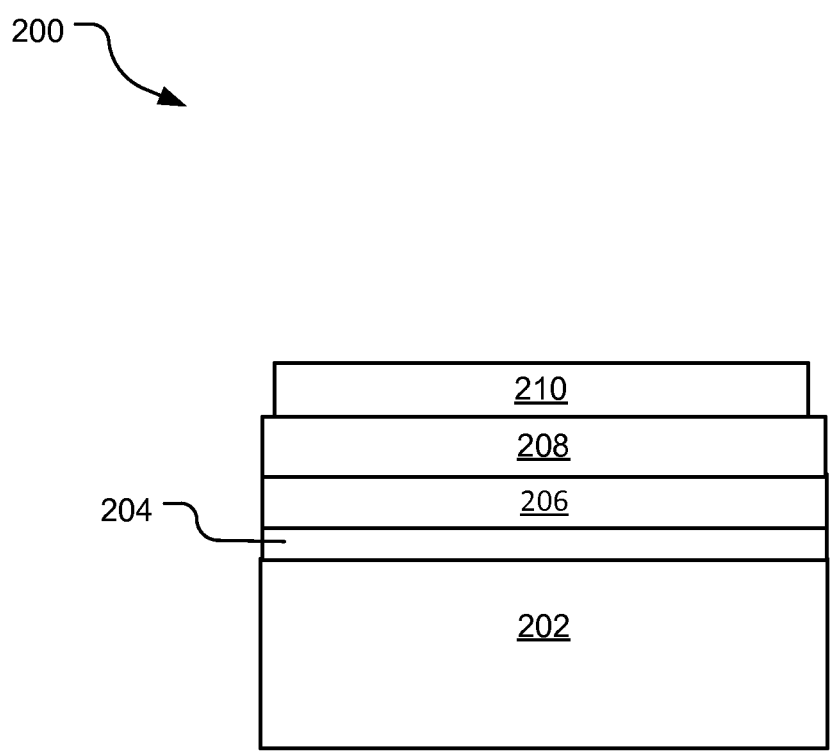
FIG. 2 illustrates an example layer stack at an early stage in formation of an engineered substrate for use in a GaN-based device.

FIG. 2 illustrates an example layer stack 200 at an early stage in formation of an engineered substrate for use in a GaN-based device. The layer stack 200 includes a bulk GaN substrate 202 with a number of layers formed thereon, including a bonding layer 204, an etch stop layer 206, an adhesion layer 208, and a stressor layer 210.

During a first deposition operation, the bonding layer 204 is deposited on the bulk GaN substrate 202. The bonding layer 204 facilitates a bond between the bulk GaN substrate 202 and a subsequently-formed etch stop layer 204. In one implementation, deposition of the bonding layer 204 is accomplished by way of a pressure chemical vapor deposition (LPCVD) process or a plasma-enhanced chemical vapor deposition (PECVD) process.

Composition of the bonding layer 204 may vary in different implementations. In one implementation, the bonding layer 204 includes materials suitable for direct or plasma-activated fusion bonding, such as silicon dioxide ($SiO_2$) and/or silicon nitride (SiN). For example, the bonding layer 204 may include a layer of $SiO_2$ over a SiN layer, with the SiN deposited in-situ following the growth of the bulk GaN substrate 202. One advantage to using a transparent layer such as $SiO_2$ or SiN for the bonding layer 204 is that a transparent layer does not impact the performance of an LED built on an engineered substrate including a portion of the bulk GaN substrate 202 and the bonding layer 204.

In another implementation, the bonding material 204 includes materials suitable for eutectic bonding (e.g. Cu—Sn) or reaction bonding (Ni—Si), provided such materials are refractory and can survive the high processing temperatures that the engineered substrate may undergo during fabrication of devices on the engineered substrate.

In one implementation, the bonding layer 204 is deposited onto the bulk GaN substrate via a LPCVD process at a temperature between approximately 750 and 850° C. In another implementation, the bonding layer 204 is deposited via a PECVD process at a temperature of less than approximately 400° C. A capping layer of CVD SiN can also be deposited in-situ on the GaN surface following GaN growth.

To prevent the bonding layer 204 from blistering, cracking, or weakening the bulk GaN substrate 202 during subsequent high temperature processing, a high temperature annealing process may be performed to remove residual hydrogen and volatile hydrocarbons from the bonding layer 204.

An etch stop layer 206 is deposited on top of and adjacent to the bonding layer 204. The etch stop layer 206 is a material that is removable via a wet etch (e.g., dilute HF) or dry etch (fluorocarbon-based etch) without damaging the bonding layer 204. A variety of materials may be suitable for the etch stop layer, including without limitation silicon dioxide and silicon nitride.

An adhesion layer 208 is deposited on the etch stop layer 206 to serve as an interface between the etch stop layer 206 and a subsequently formed stressor layer 210. The adhesion layer 208 is a material that strongly adheres to the etch stop layer 206, such as a titanium, chromium, or other conductive material. In one implementation, the adhesion layer 208 is between approximately 50 and 100 nm thick.

In one implementation (not shown), the adhesion layer 208 has a diameter that exceeds a diameter of other layers of the underlying layer stack 200. Specifically, the adhesion layer 208 may have a protruding rim that extends just beyond the outer rim of the etch stop layer 206.

A stressor layer 210 is formed on top of and in contact with a layer engineered to bend under a force to apply a compressive stress to the underlying structure at a predetermined depth. Making the adhesion layer 208 especially large (as shown) can facilitate electroplating of a stressor layer to extend out to the very edge of the wafer (e.g., the edge of the bulk GaN substrate and/or other underlying layers). This enables a full-wafer "spalling," which is described in detail with respect to other figures, below.

In at least one implementation, a single layer serves as both the adhesion and etch stop layer. Suitable materials for such a layer include without limitation titanium, chromium, tungsten, and titanium tungsten.

In one implementation, the stressor layer 210 is formed on the adhesion layer 208 during a high-stress electroplating process. For example, the stressor layer 210 may be a layer of nickel approximately 10-30 µm thick. The use of nickel allows for relatively low-cost deposition of thick layers via electroplating and sputtering. Other materials suitable for the stressor layer include without limitation boron, phosphorus-doped nickel, Ti, Cr, Fe, and W and their nitrides and carbides. In one implementation, the stressor layer 210 is a composite layer including stacks of high tensile stress materials. The high tensile stress can induce a compressive stress in the underlying layers and therefore be used to initiate spalling and cracking of the underlying layer stack 200. A few example tools for creating and shaping the stressor layer 210 are described in greater detail with respect to FIG. 3, below.

Figure 3:
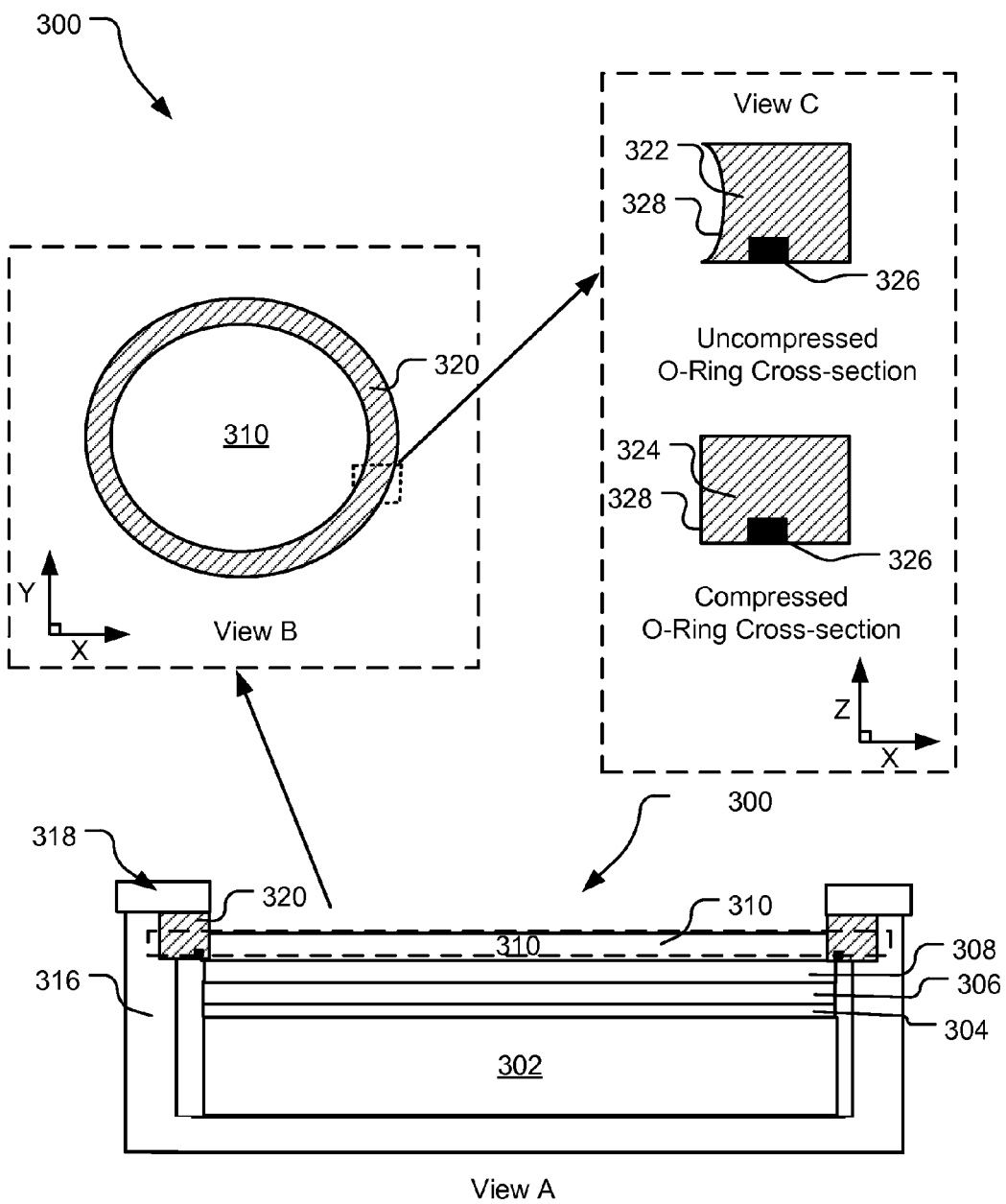
FIG. 3 illustrates an electroplating process utilized to form a stressor layer on a layered stack in a process for engineering a substrate for use in a GaN-based device.

FIG. 3 illustrates an electroplating process utilized to form a stressor layer 310 on a layered stack 300 (e.g., a wafer) in a process for engineering a substrate for use in a GaN-based device. In addition to the stressor layer 310, the layered stack 300 includes a bulk GaN substrate 302, a bonding layer 304, an etch stop layer 306, and an adhesion layer 308.

To enable full wafer spalling during a subsequent spalling operation, the stressor layer 310 is made to extend as far as possible up to the edge of the layered stack 300 (e.g., up to the edge of the underlying adhesion layer 308). In addition, the stressor layer 310 is engineered to include an abrupt outer edge, which may facilitate a controlled fracture during a subsequent spalling process.

Within FIG. 3, various views A, B, and C illustrate aspects of the layered stack 300 and tooling used to develop the stressor layer 310. More specifically, view A illustrates a cross-sectional view of the layer stack 300 positioned within a base 316 below a mask 318. The mask 318 includes an o-ring 320 that shields the perimeter of the layered stack 300 during the electroplating process that forms the stressor layer 310. View B of FIG. 3 illustrates a top-down view of the o-ring 320 after the layer stack 300 undergoes the electroplating process to form the stressor layer 310.

Referring next to view C, a cross-section of an edge portion of the o-ring 320 is shown in both an uncompressed view 322 and a compressed view 324. As illustrated in the compressed view 324, the o-ring 320 has an inner edge 328 that is concave when no external force is applied. When the o-ring is compressed, the inner edge 328 is substantially linear and perpendicular to the underlying layers of the layer stack 300. This linear (e.g., rather than curved) inner edge 328 causes the stressor layer 310 to also have an abrupt and linear outer edge when formed via the electroplating process. For example, the stressor layer 310 may have an outer edge that is substantially perpendicular to the underlying layers.

In FIG. 3, a thin piece of conductive material 326 is sandwiched between the o-ring 320 and the layer stack 300. The conductive material 326 provides a conductive path to the layer stack 300, which allows for the o-ring 320 to be made out of a non-conductive material. For example, the o-ring may be made out of buna, silicone, or Fluorosilicone materials. The conductive material 326 may have a rounded cross-section (as shown), rectangular-cross section, or cross-section of another shape.

In one implementation, the electroplating process used to form the stressor layer 310 does not utilize the thin piece of conductive material 326. This is possible when, for example, the o-ring 320 is itself made out of a conductive material. Suitable conductive materials may include, for example Ag/Cu loaded silicone or fluorosilicon.

Figure 4:
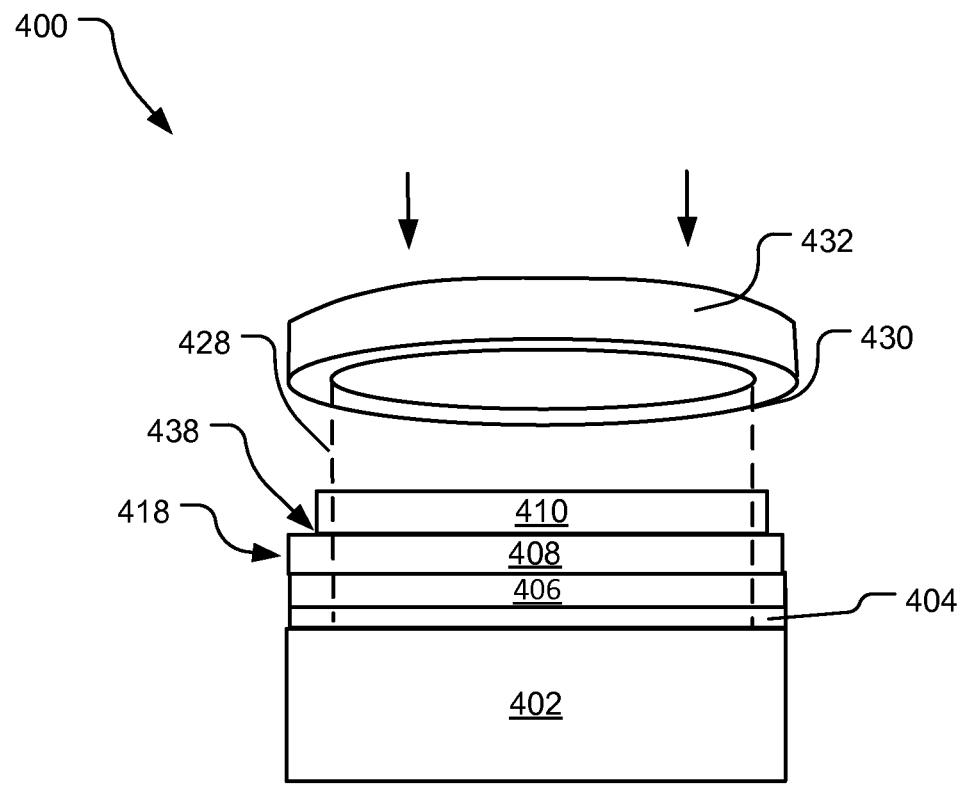
FIG. 4 illustrates an example edge shaping process used to form of an abrupt edge on a layered stack during formation of an engineered substrate for use in a GaN-based device.
Figure 4:
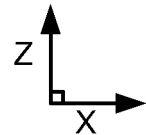

After electroplating of the stressor layer 310, other steps may be taken to sharpen an abrupt outermost edge of the stressor layer 310, as described in greater detail with respect to FIG. 4.

FIG. 4 illustrates an example edge shaping process used to form an abrupt outer edge on a portion of a layered stack 400 (e.g., a wafer) during formation of an engineered substrate for use in a GaN-based device. Although many tools and processes may be suitable for edge shaping, the illustrated implementation utilizes a circular abrasive wheel 432 to shave material from the outermost edge of the layered stack 400.

A cutting track of the circular abrasive wheel 432 is roughly indicated by dotted lines 428 and 430. The circular abrasive wheel 432 is oriented such that a diameter of the wheel is substantially parallel to a diameter of the layer stack 400 (e.g., the wafer diameter). The circular abrasive wheel 432 is lowered, while spinning, down on top of the layer stack 400 and gradually removes material from around the edges of the layer stack 400. In one implementation, the circular abrasive wheel is positioned by a vision system that locates a center of a stressor layer 410 and then places the circular abrasive wheel 432 down on top layer stack 400, trimming away at edge material of the stressor layer 410.

In another implementation, edges of the stressor layer 410, adhesion layer 408, and an etch stop layer 406 are trimmed via a chemical etch trim. During the chemical etch trim, a specialized mask is formed to protect certain exposed surfaces and a chemical is used to etch away areas that are not protected by the specialized mask.

In still another implementation, edges of the stressor layer 410, adhesion layer 408, etch stop layer 406 and/or bonding layer 404 are trimmed using a grinding tool. For example, a grinding tool with a sharp, rotating outer edge may contact a side surface 418 of the layered stack 400 and remove material by grinding away at the side surface 418 (e.g., rather than the top surface, as shown). The layered stack 400 may be rotated during the grinding to provide for even grinding on all sides, or the layered stack 400 may remain stationary while the grinding tool is moved about the circumference of the layered stack 400.

Trimming of the stressor layer 410 (as shown) provides an abrupt outer edge that concentrates stress during a subsequent spalling process to enable spalling at a specific depth within a bulk GaN substrate 402. One example spalling process is described in greater detail with respect to FIG. 5, below.

In at least one implementation, edges of the adhesion layer 408 are not trimmed. Allowing the edges of the adhesion layer 408 to protrude from the layer stack 400 (e.g., as shown) provides a contact point 438 where a mechanical scribe can be used to initiate a crack that propagates vertically downward (along the z-direction) and then horizontally through the wafer (along the x-direction) during a subsequent spalling process. This may enable a full-wafer lift-off when the stressor layer is subsequently lifted away from the underlying layers.

FIG. 5 illustrates a spalling operation of an example layer stack 500 during formation of an engineered substrate for use in a GaN-based device. Among other layers, the layer stack 500 includes a liftable layer 512 that supplies a point of grip or leverage for applying a compressive stress via a stressor layer 510 to an underlying structure. In various implementations, the liftable layer 512 may be a handle and/or an adhesive tape or other leverage or grip-providing mechanism that adheres to the stressor layer 510. For example, the liftable layer 512 may be a thermal or UV release tape that softens temporarily to adhere to metal and release when heated.

Application of z a tape adhesive, and a spring-loaded roll tensioning device is used to keep the tape tensioned when applied to the layer stack 500. In another implementation, a pair of independently controlled grippers (e.g., robotic grippers) are used to maintain tension in the liftable layer 512 while the liftable layer 512 is applied to the layer stack 500. Gripper tensioning may be achieved, for example, by a spring tensioning system or simply a robotic controlled motion that maintains exact tension while the liftable layer 512 is attached to the layer stack 500 and/or while the liftable layer 512 is subsequently removed from the layer stack 500 during a spalling process.

When the liftable layer 512 is peeled back or lifted upward or at an angle away from a bulk GaN substrate 502 (e.g., such as by lifting up at a leverage point 514, as shown), the stressor layer 510 applies a compressive stress at a predetermined depth to create a fracture within the bulk GaN substrate 502, causing the upper portion 502(a) to separate away from a lower portion 502(b). According to one implementation, the compressive stress causes a crack that propagates vertically in the z-direction, as shown by a vertical fracture 515, and then propagates laterally (e.g., in the x-direction) at a predetermined depth (e.g., z-coordinate) as shown by a lateral fracture 517. This intentional fracturing and controlled propagation is also referred to herein as "spalling."

In FIG. 5, the vertical fracture 515 propagates through an adhesion layer 508, etch stop layer 506, bonding layer 504, and through the upper portion 502a of the GaN substrate layer 502. The thickness of the stressor layer 510 may be tuned to control the depth of the fracture, while the stress in the stressor layer 510 determines an additional energy required to initiate and promote the fracture. This additional energy is provided, for example, by lifting the liftable layer 512.

To help guide propagation of the fracture into the bulk GaN layer 502, an abrupt edge 516 may be formed on an exterior surface of the layer 508 and/or etch stop layer 506, as shown. For example, the material may be removed from the outer edge of an adhesion layer 508, etch stop layer 506, and stressor layer 510, such as by way of a chemical or mechanical etching process, such as that described with respect to FIG. 5.

In another implementation, the adhesion layer protrudes outward of the underlying layers and the stressor layer 510, and a mechanical scribe is used to generate a small crack in an exposed surface of the adhesion layer 508 at a desired fracture initiation point. This crack propagates to the predetermined depth when a force is applied to the liftable layer 512 to apply the compressive stress via the stressor layer 510.

In one implementation, the upper portion 502a of the bulk GaN substrate 502 has a z-direction thickness of between approximately 3 and 15 microns after the illustrated separation. After separation from the lower portion 502b of the bulk GaN substrate 502, the upper layers of the stack 500 undergo additional processing.

The lower portion 502b of the bulk GaN substrate 502 may be polished and subjected to a chemical-mechanical planarization process in preparation for regrowth of additional GaN thereon. In one implementation, planarization entails removing enough material from the lower portion 502b to achieve a smooth surface (typical roughness <1 nm), restore the original surface planarity (total thickness variation, bow and warp of <10 μm), off-cut (angle of the surface relative to the orientation of the crystalline axis which is typically 0.2 degrees for c-axis bulk GaN), and achieve a target substrate thickness (e.g., 300-350 μm) so that all substrates following GaN CMP are similar and indistinguishable from each other.

Additional GaN may be re-grown on the lower portion 502b of the bulk GaN substrate 502 to restore the residual GaN substrate 502 to its starting thickness (e.g., the thickness of the bulk GaN substrate 502). By ensuring that all the substrates following CMP are similar, the substrates can be processed in a batch to regrow the GaN.

Figure 6A:
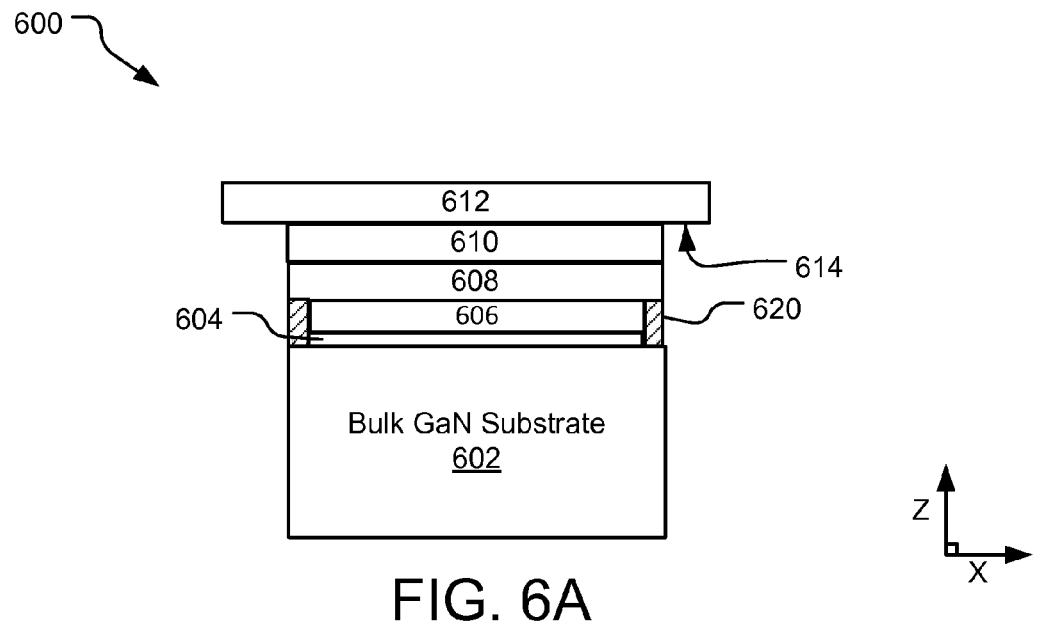
FIG. 6A illustrates aspects of an example method for spalling through a layered stack during formation of an engineered substrate for use in a GaN-based device.
Figure 6B:
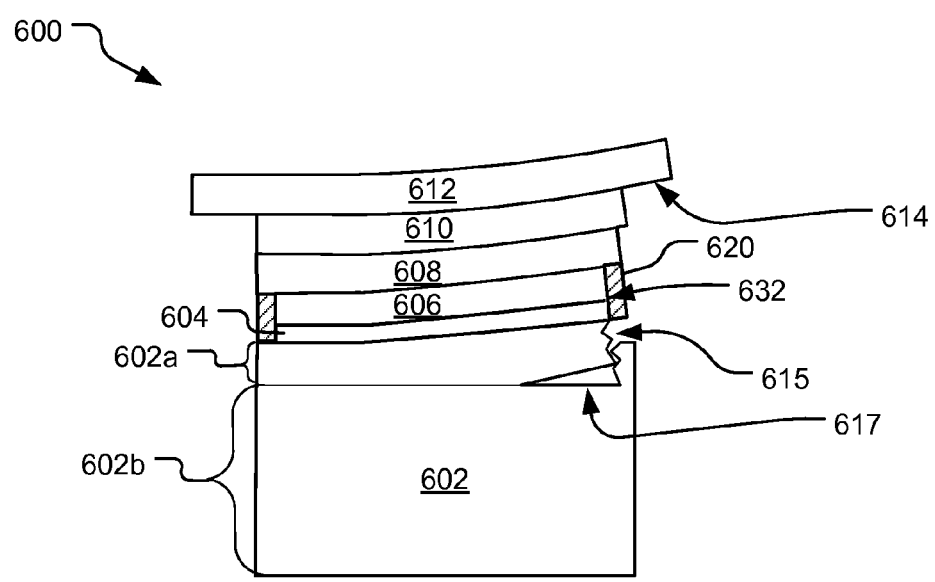
FIG. 6B illustrates still other aspects of an example method for spalling through a layered stack during formation of an engineered substrate for use in a GaN-based device.

FIGS. 6A and 6B illustrate aspects of another method for spalling through a layered stack 600 (e.g., a wafer) during formation of an engineered substrate for use in a GaN-based device. FIG. 6A illustrates the layered structure 600 prior to a spalling process. The layered structure 600 includes a layer of masking material (e.g., a photoresist or masking film) 620 applied along the side of the wafer and/or around a narrow outer rim of the layered stack 600. The masking material 620 protects underlying portions of a bulk GaN substrate 602 during subsequent formation of upper layers (e.g., a bonding layer 604 and an etch stop layer 606).

In one implementation, the masking material 620 is applied in an area where material is removed from the etch stop layer 606 and bonding layer 604. For example, material may be removed from the along a side of the layer stack 600 (e.g., the wafer side) and bevel. The masking material 620 can be applied in the areas where such material is removed. The masking material 620 may be left in place during deposition of an adhesion layer 608, causing the adhesion layer 608 to be greater in diameter than the underlying etch stop layer 606 (as shown).

In one implementation, the adhesion layer 608 is deposited to cover the entire wafer surface including the bevel and sides. A stressor layer 610 is electroplated using an electrical contact along the wafer bevel or wafer side so that the stressor 610 extends to the edge of the layer stack 600 (e.g., the wafer edge). One of many suitable types of masking film is an organic film that dissolves when dipped in a solvent such as isopropyl alcohol or acetone.

FIG. 6B illustrates the layered structure 600 after a spalling process. When tension is applied to a liftable layer 612, an upper portion of the layer stack 600 including the etch stop layer 606, adhesion layer 608, the bonding layer 604, and the stressor layer 610 easily release from the masking material 620.

Upward tensioning of the liftable layer 612 causes the stressor layer 610 to generate a compressive stress at an edge point 632 where the layered stack 600 is firmly anchored to the bulk GaN substrate 602. When the liftable layer 612 is peeled back or lifted upward or at an angle away from the bulk GaN substrate 602 (e.g., such as by lifting up at a leverage point 614, as shown) the stressor layer 610 applies a compressive stress a predetermined depth to create a fracture line 617 within the bulk GaN substrate 602, causing an upper portion 602(a) to separate away from a lower portion 602(b).

The edge of the photoresist 620 determines a fracture initiation point 632 where a vertical fracture forms in the bulk GaN layer 602 upon application of the compressive stress via the stressor layer 610. The vertical fracture propagates downward the z-direction as indicated by a vertical fracture 615 and then propagates laterally along a line of predetermined depth (e.g., z-coordinate), as indicated by the lateral fracture 617.

In one implementation, the photoresist 620 is formed by applying a liquid photoresist across the surface of the bonding layer 604 and hardening portions of the photoresist 620 through an exposure process. For example, high-energy light may be used to expose portions of the photoresist 620 with a photomask in place. The un-hardened portions can be developed away, and the bonding layer 604, etch stop layer 606, and adhesion layer 608 can be subsequently deposited. In another implementation, the photoresist is applied selectively to a periphery of the layer stack 600 by screen printing, inkjet printing, or by drawing a resist pen around the periphery.

After separation from the lower portion 602b of the bulk GaN substrate 602, the upper layers of the stack 600 undergo additional processing, as described with respect to FIG. 7, below.

Figure 7:
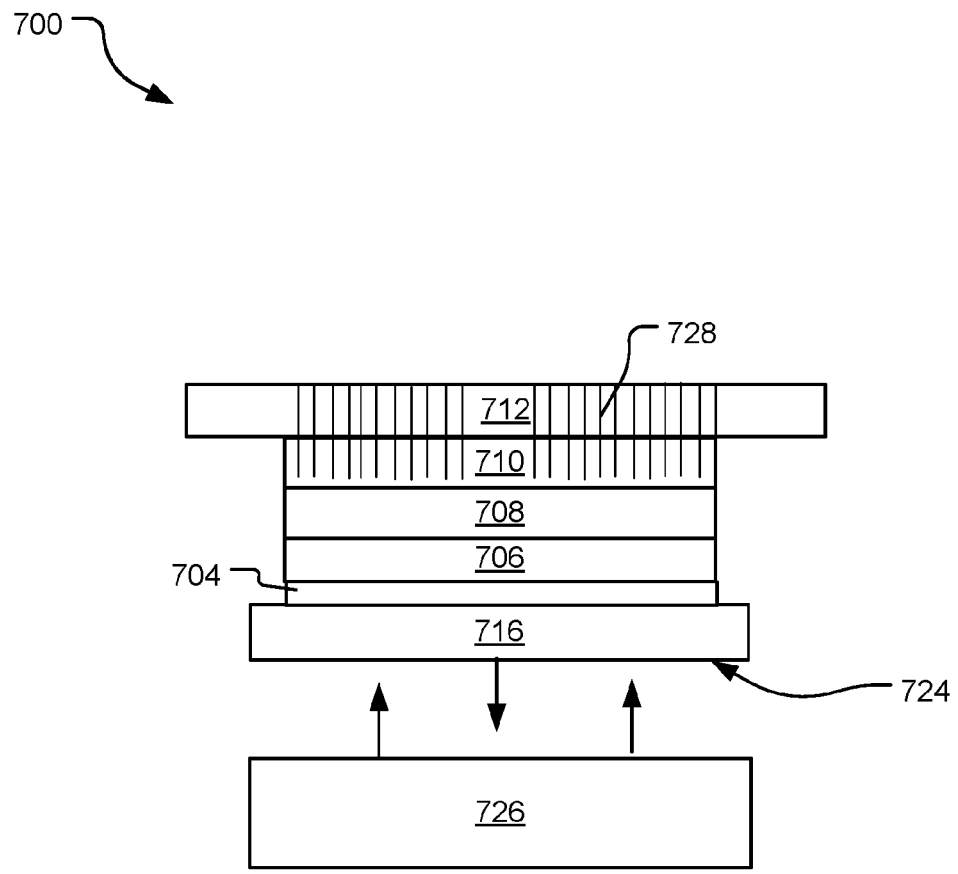
FIG. 7 illustrates an example layer stack at another stage in formation of an engineered substrate for use in a GaN-based device.
Figure 7:
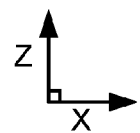

FIG. 7 illustrates example layer stack 700 at another stage in formation of an engineered substrate for use in a GaN-based device. The layer stack 700 includes a liftable layer 712, a stressor layer 710, an adhesion layer 708, an etch stop layer 706, a bonding layer 704, and a high quality GaN film layer 716. In one implementation, the high quality GaN film layer 716 is grown on a bulk GaN substrate and separated from a portion of the bulk GaN substrate via a spalling process that creates a spalled surface 724. In one implementation, the spalled surface 724 of the high quality GaN film layer 716 is substantially planar (e.g., having less than about 0.75 micron variations in surface topography) on it immediately prior to bonding to a temporary carrier 726.

Figure 8:
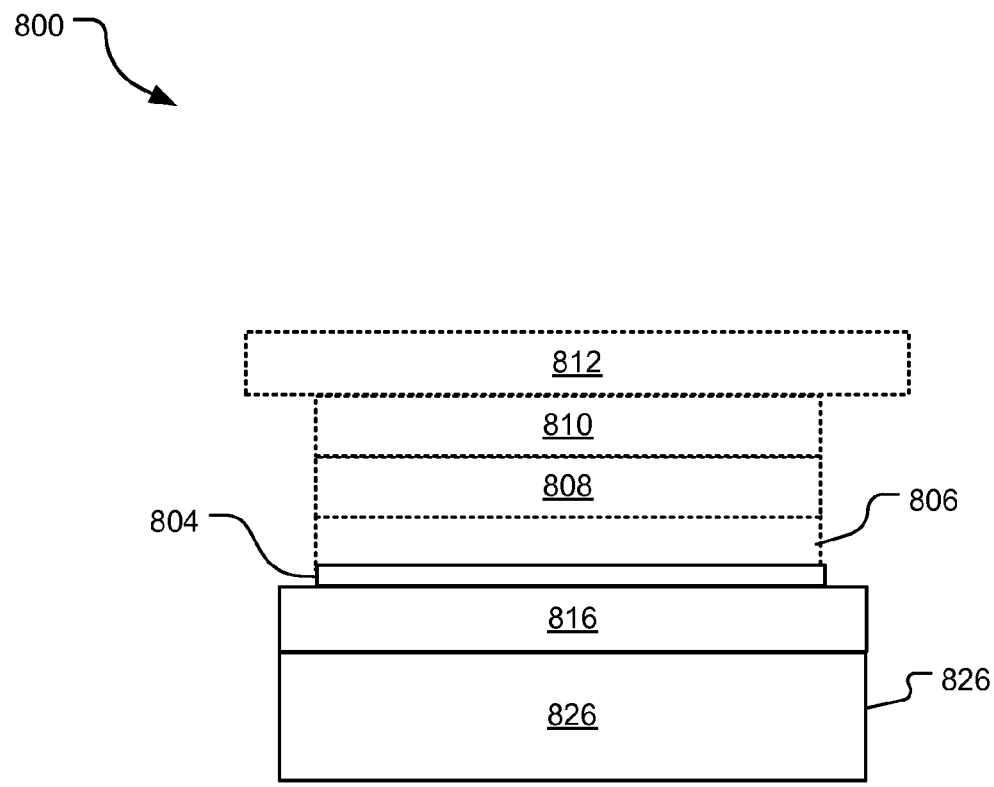
FIG. 8 illustrates an example layer stack during another stage in formation of an engineered substrate for use in a GaN-based device.

In FIG. 7, the spalled surface 724 of the high quality GaN film layer 716 is bonded to the temporary carrier 726 via a temporary bond. In one implementation, the temporary bond is heat-resistant up to temperatures of at least 300° C. or up to a temperature required for a subsequent permanent bonding step (e.g., as illustrated in FIG. 8). In some implementations, a tape frame may be used in place of a temporary carrier.

In a subsequent operation (not shown), the stressor layer 710 is removed from the layer stack 700. Removal of the highly stressed stressor material creates a resultant high stress at the interface between the temporary carrier 726 and the high quality GaN film layer 716. Therefore, there exists a trade-off between bond strength of the temporary bonding material used to bond the temporary carrier 726 and the ease of debonding later on in the process sequence.

A number of different techniques can be optionally performed to relax the bond strength requirements for the temporary bond and decrease the stress at the interface between the temporary carrier 726 and the layer stack 700. In one implementation, a compliant adhesive such as wax, epoxy, or other material is applied to the temporary carrier 726 and/or to the spalled surface 724 of the high quality GaN film 716 prior to the bonding process. The compliant adhesive can help the high quality GaN film 716 to relax during subsequent removal of the stressor layer 710, thereby mitigating a risk of damage to the high quality GaN film layer 716.

In another implementation, stress at the interface between the high quality GaN film layer 716 and the temporary carrier 726 is relaxed by singulating the stressor layer 710 partially through its thickness prior to temporary bonding. Singulation of the stressor allows the lifted-off film to become compliant with the surface of the temporary carrier for a reliable temporary bond.

For example, the stressor layer 710 can be sliced into islands to naturally relax the stress in both the stressor layer 710 and at the interface between the temporary carrier 726 and the layer stack 700. In one implementation, singulation cuts (e.g., a singulation cut 728) are made by a gang of dicing wheels so that the last few microns (i.e., 2-5 µm) of the stressor layer 710 above the adhesion layer remain intact, retaining the physical integrity of the lifted-off film.

In one implementation, a spin-on dielectric is applied to the temporary carrier 726 before bonding the temporary carrier 726 to the high quality GaN film layer 716. Application of the spin-on dielectric may be followed by a non-selective etching process (such as reactive ion etching) or polishing to etch back or remove the spin-on dielectric. In another implementation, material used to create the temporary bond planarizes while simultaneously bonding to adjacent surfaces.

In some implementations, the stressor layer 710 is removed prior to bonding the layer stack 700 to the temporary carrier 726. For example, an exposed surface of a high quality GaN film 716 (e.g., opposite the spalled surface 724) may be mounted to a flexible tape attached to a frame that includes tension control. The tension in the flexible tape can be manipulated after the stressor layer 710 is removed to flatten the high quality GaN film layer 716 while bonding the exposed surface 724 to the temporary carrier 726. In this case, the high quality GaN film 716 is temporary bonded to temporary carrier 726 with the intervening flexible tape. The flexible tape can be removed when the temporary carrier 726 is debonded in a subsequent step. If, for example, the flexible tape is a UV release tape and the temporary carrier 726 is transparent to UV light, the high quality GaN film 716 can be debonded from the flexible tape and the temporary carrier 726 by exposing the flexible tape to UV light through the temporary carrier 726.

FIG. 8 illustrates an example layer stack 800 during another stage in formation of an engineered substrate for use in a GaN-based device. The layer stack 800 includes a temporary carrier 826, a high quality GaN film layer 816, a bonding layer 804, an etch stop layer 806, an adhesion layer 808, a stressor layer 810, and a liftable layer 812.

The liftable layer 812 is first removed, such as by applying heat or UV light. A stressor layer 810 and underlying adhesion layer 808 are subsequently removed, such as via a chemical etching process. After removeable of the adhesion layer 808, the etch stop layer 806 is selectively removed by a wet etch or dry etch that does not damage the underlying layers. This etching may expose a surface of the bonding layer 804.

In one implementation, plasma activation is employed to prepare the bonding layer 804 for a subsequent bonding step.

FIG. 9 illustrates bonding of an upper stack 936 to a lower stack 938 during another stage in formation of an engineered substrate 900 for use in a GaN-based device. The upper stack 936 includes a bonding layer 904, a high quality GaN film layer 916 (e.g., originally grown on a bulk GaN stack), and a temporary carrier 926 attached via a temporary bond to the high quality GaN film layer 916 and opposite to the bonding layer 904.

The lower stack 938 includes a traditional substrate 930, another GaN layer 932, and another bonding layer 934. The traditional substrate 930 is a material that is readily available and less cost-prohibitive than a bulk GaN substrate such as, for example, a sapphire substrate, a patterned sapphire substrate (PSS), or a silicon carbide (SiC) substrate.

The GaN layer 932 in the lower stack 938 is grown on the traditional substrate 922 and is of lower quality than the high quality GaN film layer 916. In one implementation, the GaN layer 932 is approximately 1 micron (µm) thick (e.g., along a z-axis).

Growth of the GaN film 932 on the traditional substrate 930 can be accomplished using a traditional growth method that involves one or more of the following operations: a high temperature annealing, a low-temperature GaN buffer, a high temperature GaN roughening, and a GaN high-temperature growth. The growth method used to grow the GaN film layer 932 results in a smooth, fully coalesced GaN surface.

In operation, the GaN film layer 932 serves as a support layer in the engineered substrate 900, but does not affect the function of a final GaN-based device incorporating the engineered substrate. Rather, the quality of the GaN-based device is governed by the quality of the high quality GaN film layer 916. Because quality of the GaN film layer 932 is not critical, the GaN film layer 932 may be engineered to survive high temperature processing (e.g., ~1050° C.), but weak enough to fail during a mechanical lift-off (MLO) of a device stack grown on the finished engineered substrate.

The bonding layer 934 facilitates a bond between the lower stack 938 and the upper stack 936, and may include, for example, $SiO_2$, SiN, or some combination thereof. Other aspects of the bonding layer or deposition processes related to the bonding layer 934 may be the same or similar to those described with respect to the bonding layer 204 of FIG. 2.

A bond formed between the bonding layer 934 and the bonding layer 904 is a permanent bond. In one implementation, this bond is performed at a low temperature that does not substantially affect a temporary bond between the high quality GaN film 916 and the temporary carrier 920. Bonding between the bonding layer 934 and the bonding layer 904 may be accomplished in a variety of ways. One method is direct plasma activated fusion bonding, which provides a high bond strength that can survive the high temperatures that the engineered substrate may be subjected to during subsequent device fabrication. Other bonding methods that may be used include without limitation eutectic bonding, reaction bonding, etc.

Figure 10:
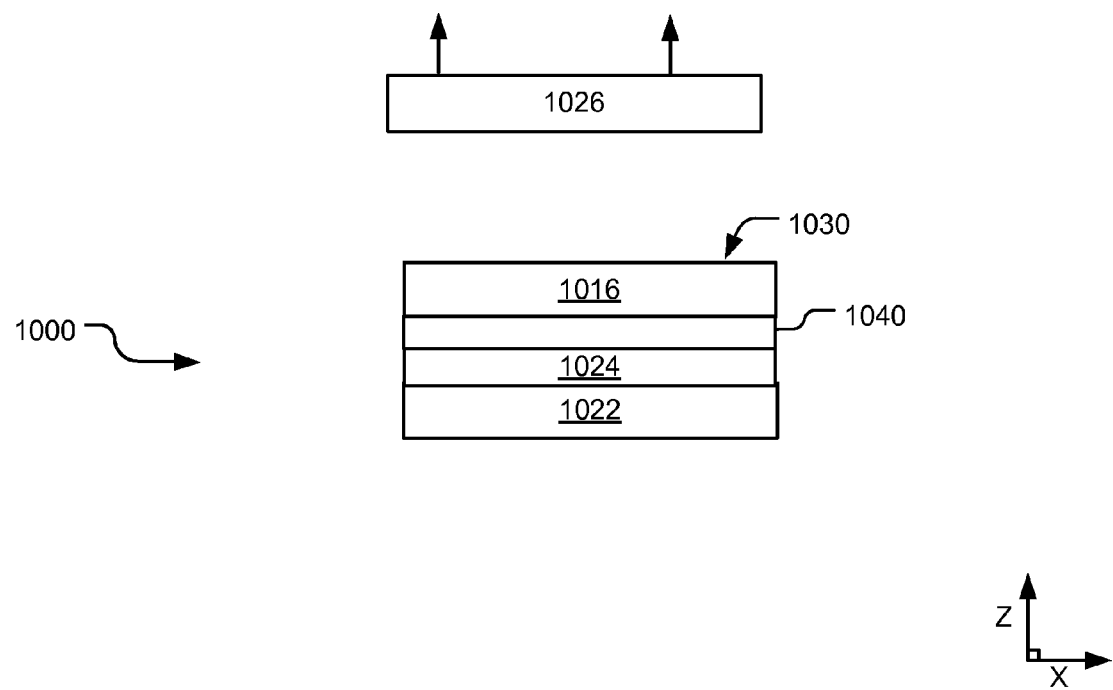
FIG. 10 illustrates detachment of a temporary carrier from an engineered substrate for use in a GaN-based device.

FIG. 10 illustrates detachment of a temporary carrier 1026 from an engineered substrate 1000 for use in a GaN-based device. The engineered substrate 1000 includes a traditional substrate 1022 made of a material that is readily available and less cost-prohibitive than a bulk GaN substrate. The traditional substrate 1022 may be, for example, a sapphire substrate, a patterned sapphire substrate (PSS), or a silicon carbide (SiC) substrate.

The engineered substrate 1000 also includes a GaN film layer 1024 formed on the traditional substrate 1022. A bonding layer 1040 facilitates a permanent bond between the GaN film layer 1024 and a high quality GaN film layer 1016. The GaN film layer 1024 may be of lower quality than the high quality GaN film layer 1016.

In one implementation, the bonding layer 1040 represents a fusion of two separate bonding layers formed on the high quality GaN film layer 1016 and the GaN film layer 1024, respectively. In at least one implementation, the bonding layer 1040 is transparent.

Detachment of the temporary carrier 1026 may be performed in a variety of ways, including without limitation heating, chemical treatment, and UV exposure. Each of these debonding solutions can weaken the adhesive force of the bonding material, allowing separation to occur. In one implementation, a flexible tape is used in place of the temporary carrier. In such case, the flexible tape is detached from the engineered substrate 1000 during the illustrated detachment operation. After detaching the temporary carrier 1026, residual bonding material can be chemically removed from the temporary carrier 1026 so that the temporary carrier 1026 can be reused.

A newly exposed surface 1030 of the high quality GaN film layer 1016 is cleaned to remove residual temporary bonding material. In one implementation, operations are performed after detachment of the temporary carrier in order to strengthen a permanent bond between the high quality GaN layer 1016 and the GaN layer 1024. For example, this permanent bond may be strengthened via a high-temperature annealing process performed at high pressure in a vacuum environment.

In one implementation, operations are performed to reduce surface topography on the exposed surface 1030 of the high quality GaN film layer 1016 and thus prepare the exposed surface 1030 for re-growth of one or more crystalline nitride layers (e.g., doped and undoped GaN layers) via Metal-Organic CVD (MOCVD) or Hyride Vapor Phase Epitaxy (HVPE). In one implementation, the exposed surface 1030 is planarized via a CMP operation. The CMP operation removes enough material to achieve a smooth surface (typical roughness <1 nm), restore the original surface planarity of the bulk GaN substrate (in terms of total thickness variation, bow and warp of <10 µm), off-cut (angle of the surface relative to the orientation of the crystalline axis), and achieve a target GaN thickness (e.g. 2-5 µm) so that all the engineered substrates following GaN CMP are similar and indistinguishable from each other.

Figure 11:
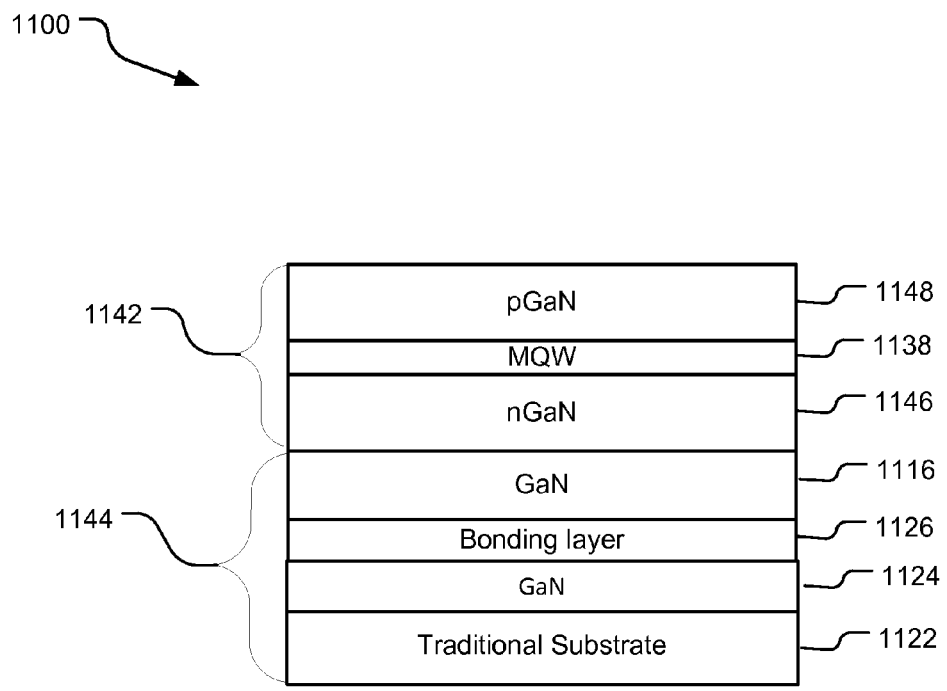
FIG. 11 illustrates a layered stack including an example device stack grown on an engineered substrate.
Figure 11:
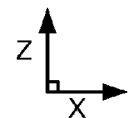

FIG. 11 illustrates a layered stack 1100 including an example device stack 1142 grown on an engineered substrate 1144. The engineered substrate 1144 includes a traditional substrate 1122 and a first crystalline nitride layer 1124 (e.g., a GaN layer) separated from a second crystalline conductive 1116 (e.g., another GaN layer) by a bonding layer 1126, which may be, for example, SiN or $SiO_2$. The second crystalline conductive 1116 is of higher quality than the first crystalline nitride layer 1124.

In one implementation, the first crystalline nitride layer 1124 is grown directly on the traditional substrate 1122 while the second crystalline nitride layer 1116 is grown on a separate, bulk substrate. In other implementations, the engineered substrate 1144 may include additional layers in place of or in addition to those illustrated in FIG. 11.

The device stack 1142 includes at least two crystalline nitride layers (e.g., crystalline nitride layers 1146 and 1148) on opposite sides of a multiple quantum well (MQW) 1138. In other implementations, the device stack 1142 includes one or more layers of GaN, AlN, AlGaN, and InGaN arranged in an order that provides for high crystal quality, crack-free films, and useful opto-electrical properties. In one implementation, the crystalline nitride layer 1146 is a negatively-doped GaN layer and the crystalline nitride layer 1148 is a positively-doped GaN layer. In other implementations, additional crystalline nitride layers may be used in place of or in addition to those layers shown. According to one implementation, the device stack 1142 is grown directly on the engineered substrate 1144.

In one implementation, a spalling process is employed to fracture the first crystalline nitride layer 1146 at a predetermined depth, allowing for lift-off of a top portion of the device stack 1142 from the remainder of the device stack and the underlying engineered substrate 1144.

Suitable methods for device-stack lift-off and LED and electronic device formation are disclosed in detail in U.S. non-provisional application Ser. No. 14/480,175 filed on Sep. 10, 2014 and titled "Tensile Separation of a Semiconducting Stack," which is herein incorporated by reference for all that it discloses or teaches.

Figure 12:
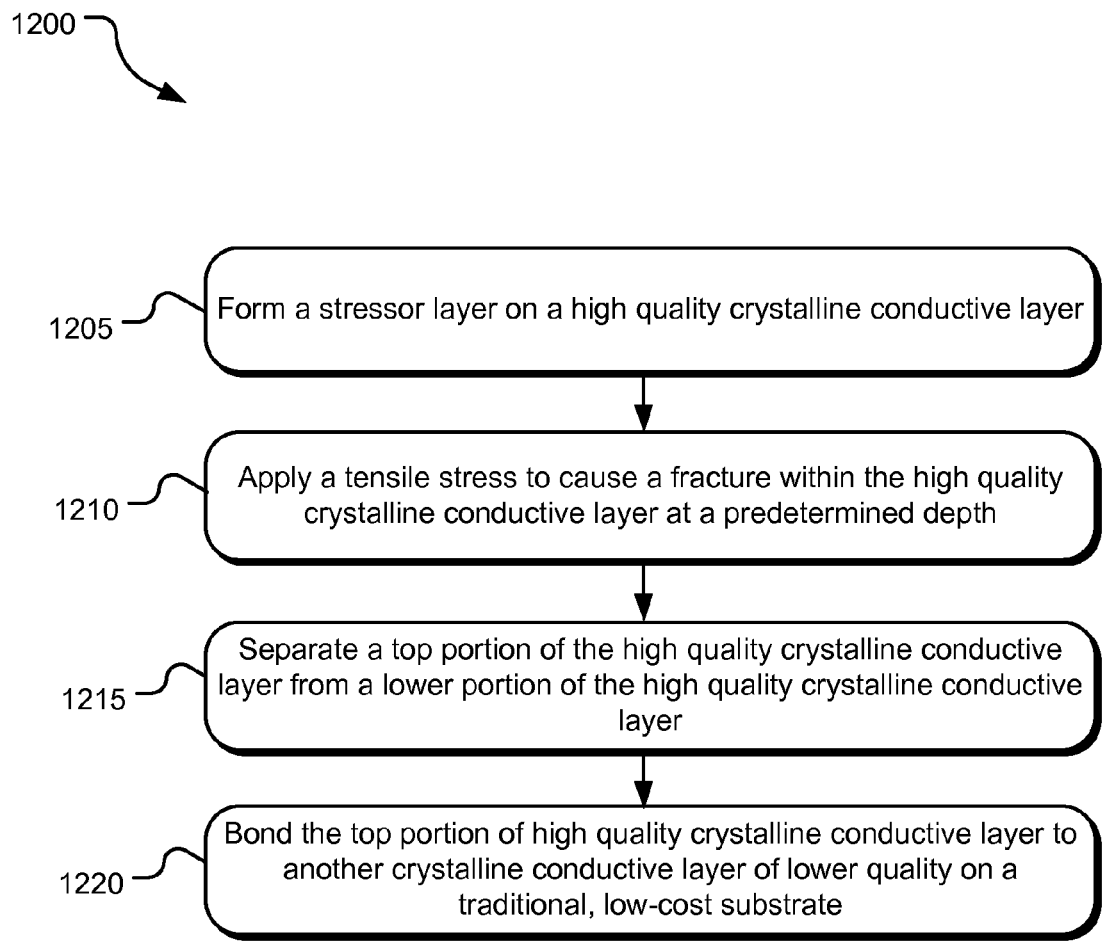
FIG. 12 illustrates example operations for forming an engineered substrate for use in a GaN-based device.

FIG. 12 illustrates example operations 1200 for forming an engineered substrate for use in a GaN-based device. A formation operation 1205 forms a stressor layer on a high quality crystalline nitride layer, such as a bulk GaN substrate. The stressor layer is engineered to bend under a force to apply a compressive stress to the underlying structure at a predetermined depth. In one implementation, the stressor layer is formed during a high-stress electroplating process. A number of layers may be formed between the high quality crystalline nitride layer and the stressor layer. In one implementation, the adhesion layer is formed on an etch stop layer and/or a bonding layer that facilitates a bond to the high quality crystalline nitride layer.

A stressor operation 1210 applies a stress to the stressor layer, causing a compressive stress at a predetermined depth in the high quality crystalline nitride layer. The compressive stress causes a controlled fracturing within the high quality crystalline nitride layer, and facilitates a separation of the high quality crystalline nitride layer into multiple portions without causing incidental sub-surface damage.

A separation operation 1215 separates a top portion of the high quality crystalline nitride layer from a lower portion of the high quality crystalline nitride layer along the line of fracture created by the stressor operation 1210. The lower portion of the high quality crystalline nitride layer can be reused multiple times to grow several different high quality crystalline nitride layers for use in different engineered substrates. The upper portion of the high quality crystalline nitride layer undergoes additional processing for integration into an engineered substrate that can be used to form a GaN-based device, such as an LED stack.

A bonding operation 1220 bonds the top portion of the high quality crystalline nitride layer to a lower quality crystalline nitride layer. For example the lower quality crystalline nitride layer may be formed on, and therefore, attached to a traditional low-cost substrate such as sapphire, patterned sapphire (PSS), or silicon carbide (SiC). In one implementation, the bonding operation 1220 results in an engineered substrate including the following layers from bottom to top: a traditional low-cost substrate base, the low quality crystalline nitride layer, a transparent bonding layer, and the high quality crystalline nitride layer. The engineered substrate includes an exposed surface of the high quality crystalline nitride layer that is suitable for re-growth of one or more crystalline nitride layers (e.g., doped and undoped GaN layers) via Metal-Organic CVD (MOCVD) or Hyride Vapor Phase Epitaxy (HVPE).

It should be understood that the various process and manufacturing operations making up the embodiments of the herein disclosed technology may be performed in any order, adding and omitting as desired, unless explicitly claimed otherwise or a specific order is inherently necessitated by the claim language.

The above specification, examples, and data provide a complete description of the structure and use of exemplary embodiments of the disclosed technology. Since many embodiments of the disclosed technology can be made without departing from the spirit and scope of the disclosed technology, the disclosed technology resides in the claims hereinafter appended. Furthermore, structural features of the different embodiments may be combined in yet another embodiment without departing from the recited claims.

What is claimed is:

1. A method comprising:
   forming a structure including a crystalline nitride substrate and at least one adjacent layer;
   trimming an edge of the at least one adjacent layer to form an abrupt outer edge exposed on the structure exterior and radially inward of an outer edge of the crystalline nitride substrate;
   after the trimming, initiating a fracture at the abrupt outer edge and propagating the fracture laterally through the crystalline nitride substrate to separate a first crystalline film layer from the crystalline nitride substrate;
   bonding the first crystalline film layer to a second crystalline film layer, the second crystalline film layer of lower quality than the first crystalline film layer.

2. The method of claim 1, wherein the crystalline nitride substrate is a bulk gallium-nitride (GaN) substrate.

3. The method of claim 1, wherein the second crystalline film layer is formed on and attached to a traditional substrate including at least one of sapphire, patterned sapphire (PSS), silicon carbide, and silicon.

4. The method of claim 1, further comprising:
   forming a stressor layer on top of the crystalline nitride substrate, the stressor layer configured to bend under a force to apply a compressive stress to an underlying structure at a predetermined depth.

5. The method of claim 4, wherein forming the stressor layer further comprises:
   forming the stressor layer on top of an adhesion layer.

6. The method of claim 5, wherein the adhesion layer has a diameter that is larger than a diameter of any underlying layer.

7. The method of claim 4, further comprising:
   applying a liftable layer to contact the stressor layer, the liftable layer supplying a point of leverage for applying the compressive stress to the underlying layers via the stressor layer.

8. The method of claim 7, wherein the liftable layer is at least one of a thermal or UV release tape that releases from metal when heated.

9. The method of claim 7, further comprising:
   adjusting the tension in the liftable layer to flatten the first crystalline film layer prior to the bonding operation.

10. The method of claim 1, wherein the propagating operation further comprises:
    applying a force to a stressor layer to create a controlled fracture at a predetermined depth in the crystalline nitride substrate.

11. The method of claim 1, further comprising:
    after the propagating operation, forming at least one cut in a stressor layer to relieve stress.

12. The method of claim 1, further comprising:
    applying a compliant adhesive to the first crystalline film layer to allow the first crystalline film layer to relax during a subsequent removal of a stressor layer.

13. The method of claim 1 wherein the abrupt outer edge is an edge of a stressor layer configured to bend under a force to apply a compressive stress to an underlying structure at a predetermined depth.

* * * * *